(12) United States Patent
Pan et al.

(10) Patent No.: US 10,998,274 B2
(45) Date of Patent: May 4, 2021

(54) SEAL RING STRUCTURE, SEMICONDUCTOR DIE, AND METHOD FOR DETECTING CRACKS ON SEMICONDUCTOR DIE

(71) Applicant: MEDIATEK INC., Hsin-Chu (TW)

(72) Inventors: Chung-We Pan, Hsinchu (TW); Ching-Hung Fu, Hsinchu (TW); Kuo-Lung Fan, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 273 days.

(21) Appl. No.: 16/157,274

(22) Filed: Oct. 11, 2018

(65) Prior Publication Data

US 2019/0164911 A1 May 30, 2019

Related U.S. Application Data

(60) Provisional application No. 62/592,532, filed on Nov. 30, 2017.

(51) Int. Cl.
*H01L 23/00* (2006.01)
*H01L 21/66* (2006.01)
(Continued)

(52) U.S. Cl.
CPC ............ *H01L 23/562* (2013.01); *G01R 27/02* (2013.01); *G01R 31/2831* (2013.01);
(Continued)

(58) Field of Classification Search
None
See application file for complete search history.

(56) References Cited

U.S. PATENT DOCUMENTS 9,064,939 B2 6/2015 Yang et al.
9,640,489 B2 5/2017 Hung et al.
(Continued)

FOREIGN PATENT DOCUMENTS

CN 102832204 A 12/2012
CN 102956618 A 3/2013
(Continued)

OTHER PUBLICATIONS

Chinese language office action dated Jun. 6, 2020, issued in application No. CN 201811268547.4.

*Primary Examiner* — Jermele M Hollington
*Assistant Examiner* — Suresh K Rajaputra
(74) *Attorney, Agent, or Firm* — McClure, Qualey & Rodack, LLP

(57) ABSTRACT

A seal ring structure is provided. The seal ring structure includes a seal ring on a semiconductor substrate. The seal ring includes a first interconnect element and a plurality of second interconnect elements. The first interconnect element is formed on a shallow trench isolation (STI) region and a first group of P-type doping regions over the semiconductor substrate. The second interconnect elements are formed below the first interconnect element and on a second group of P-type doping regions over the semiconductor substrate. The second interconnect elements are electrically separated from the first interconnect element, and the first and second groups of P-type doping regions are separated by the STI region.

20 Claims, 6 Drawing Sheets

(51) Int. Cl.
  *H01L 21/765* (2006.01)
  *H01L 29/40* (2006.01)
  *G01R 31/28* (2006.01)
  *G01R 27/02* (2006.01)
  *H01L 23/522* (2006.01)
  *H01L 23/58* (2006.01)

(52) U.S. Cl.
  CPC ............ *H01L 21/765* (2013.01); *H01L 22/32* (2013.01); *H01L 22/34* (2013.01); *H01L 23/522* (2013.01); *H01L 23/585* (2013.01); *H01L 29/402* (2013.01); *H01L 23/5226* (2013.01)

(56) References Cited

U.S. PATENT DOCUMENTS

| | | |
|---|---|---|
| 2009/0321734 A1 | 12/2009 | Ogawa et al. |
| 2011/0006389 A1 | 1/2011 | Bachman et al. |
| 2014/0375341 A1* | 12/2014 | Fender ................. H01L 23/585 324/693 |
| 2017/0256504 A1* | 9/2017 | Minami ............... G11C 29/022 |

FOREIGN PATENT DOCUMENTS

| | | |
|---|---|---|
| CN | 103943606 A | 7/2014 |
| JP | 2010-281625 A | 12/2010 |

* cited by examiner

SEAL RING STRUCTURE, SEMICONDUCTOR DIE, AND METHOD FOR DETECTING CRACKS ON SEMICONDUCTOR DIE

CROSS REFERENCE TO RELATED APPLICATIONS

This Application claims priority of U.S. Provisional Application No. 62/592,532, filed on Nov. 30, 2017, the entirety of which is incorporated by reference herein.

BACKGROUND OF THE INVENTION

Field of the Invention

The invention relates to a semiconductor die, and more particularly to a semiconductor die with a seal ring for detecting cracks.

Description of the Related Art

A seal ring is generally formed between scribe lines and integrated circuits of each die on a wafer, and the seal ring is formed by alternatively laminating dielectric layers and metal layers, which interconnect by vias through the dielectric layers. When a wafer dicing process is performed along the scribe lines, the seal ring can block unintended stress cracks from the scribe lines to the integrated circuits produced during the wafer dicing process. Also, the die seal ring can block moisture penetration or chemical damage like acid, alkaline containing or diffusion of contaminating species. Using current semiconductor technology, a double die seal ring structure has been developed to solve the more significant problem of cracking. However, the issue of cracking is still important due to the further scaling-down of the semiconductor device and increasing demands for smaller dimensions and more functions in consumer products.

Therefore, a seal ring capable of detecting cracks is desirable.

BRIEF SUMMARY OF THE INVENTION

A seal ring structure, a semiconductor die, and a method for detecting cracks on a semiconductor die are provided. An embodiment of a seal ring structure is provided. The seal ring structure comprises a first seal ring on a semiconductor substrate. The first seal ring comprises a first interconnect element and a plurality of second interconnect elements. The first interconnect element is formed on a shallow trench isolation (STI) region and a first group of P-type doping regions over the semiconductor substrate. The second interconnect elements are formed below the first interconnect element and on a second group of P-type doping regions over the semiconductor substrate. The second interconnect elements are electrically separated from the first interconnect element, and the first and second groups of P-type doping regions are separated by the STI region.

Furthermore, an embodiment of a semiconductor die is provided. The semiconductor die comprises a semiconductor substrate, an integrated circuit region on the semiconductor substrate, and a first seal ring on the semiconductor substrate. The first seal ring comprises a first interconnect element and a plurality of second interconnect elements. The first interconnect element completely surrounds the integrated circuit region, and is formed on a shallow trench isolation (STI) region and a first group of P-type doping regions over the semiconductor substrate. The second interconnect elements are formed below the first interconnect element and on a second group of P-type doping regions over the semiconductor substrate. The second interconnect elements are electrically separated from the first interconnect element, and the first and second groups of P-type doping regions are separated by the STI region.

Moreover, an embodiment of a method for detecting cracks on a semiconductor die is provided. A seal ring is formed on a semiconductor substrate of the semiconductor die. The seal ring comprises a first interconnect element and a plurality of second interconnect elements. The first interconnect element completely surrounds the integrated circuit region, and is formed on a shallow trench isolation (STI) region and a first group of P-type doping regions over the semiconductor substrate. The second interconnect elements are formed below the first interconnect element and on a second group of P-type doping regions over the semiconductor substrate. The resistance of the portion of the semiconductor substrate that is located between two of the second interconnect elements is measured through the seal ring by at least one sensing circuit. It is determined whether a crack is present in the portion of the semiconductor substrate according to the resistance of the portion of the semiconductor substrate.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Die seal ring structures (also referred to as 'chip seal rings' or 'seal rings') are commonly used around the periphery of integrated circuits (ICs) in order to protect the circuit components from mechanical damage both during assembly and in operation. The main risk of mechanical damage in assembly arises from cracks in the dielectric layers which may occur when a processed wafer is diced into individual die (e.g. using a wafer saw). These cracks in the dielectric layers may then propagate further into the die if it is thermally cycled (e.g. during assembly or during operation). Other damage, such as chipping, may also occur when the wafer is diced. In operation, the die seal ring protects the chip edge from the diffusion of moisture and mobile ions (also referred to as 'ionic contamination') into the die. If moisture ingress is not stopped, the moisture can result in an increase in the dielectric constant of oxides and reduce the reliability of the die through various mechanisms. The ingress of mobile ions, if allowed, can also affect the reliability and performance of the IC.

Figure 1A:
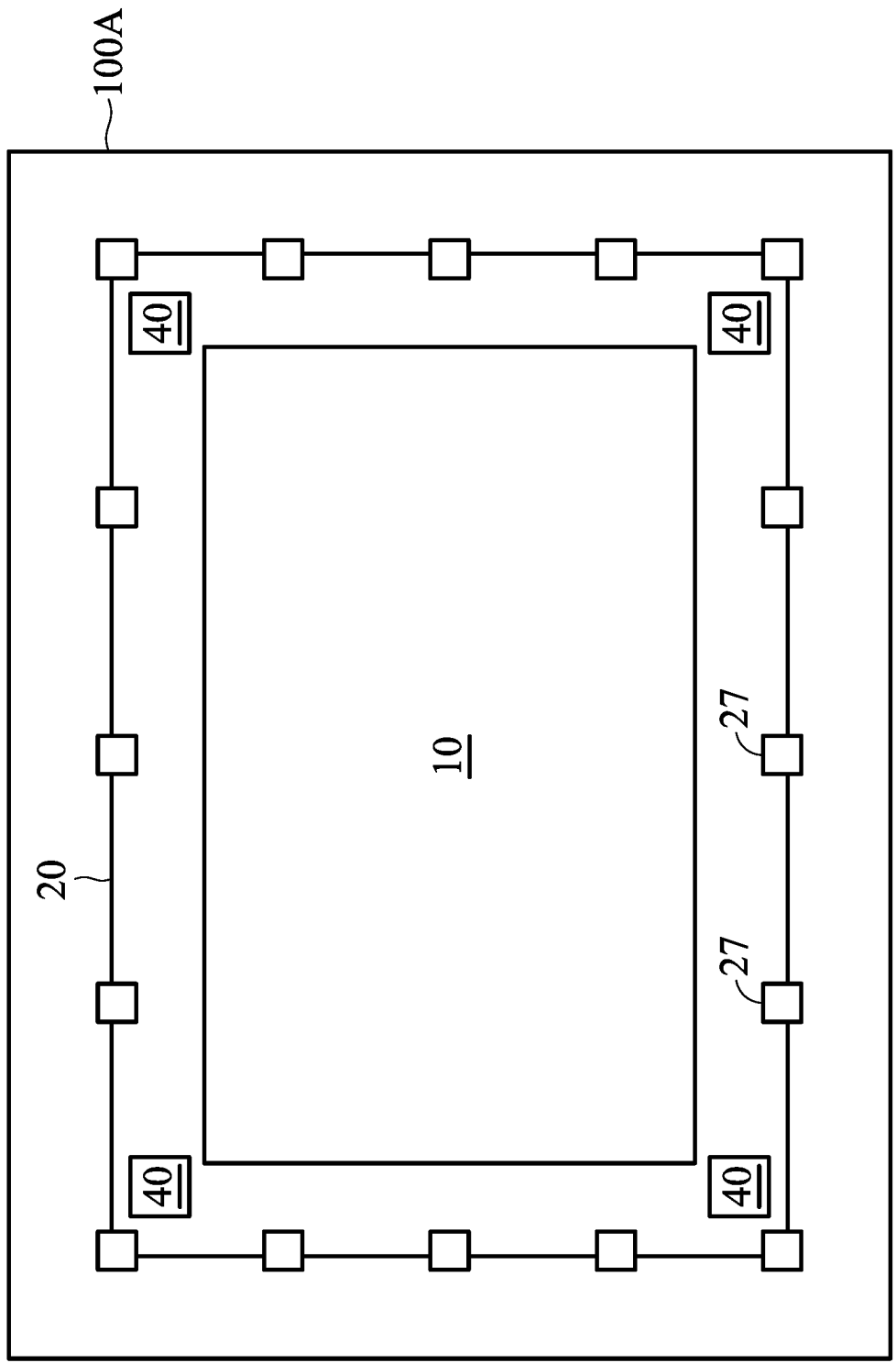
FIG. 1A shows a semiconductor die according to an embodiment of the invention.

FIG. 1A shows a semiconductor die 100A according to an embodiment of the invention. The semiconductor die 100A comprises an integrated circuit (IC) region 10, a seal ring 20 and one or more sensing circuits 40. The seal ring 20 is formed on the exterior side of the IC region 10 and surrounds the entire IC region 10. In other words, the IC region 10 is completely surrounded by the seal ring 20. The seal ring 20 is used as a blocking wall for protecting the IC region 10 from external stress while a semiconductor wafer comprising the semiconductor dies 100A is diced. The cutting operation is performed by using a cutter to cut the semiconductor wafer into individual semiconductor dies 100A along the scribe lines between the semiconductor dies 100A. Each sensing circuit 40 is disposed between the IC region 10 and the seal ring 20. In some embodiments, the sensing circuits 40 are arranged between the corner of the IC region 10 and the corners of the seal ring 20. In other words, the sensing circuits 40 are arranged outside the corner of the IC region 10, i.e. at the inner corners of the seal ring 20. A plurality of sensing points 27 are arranged in the seal ring 20. By using any two of the sensing points 27 of the seal ring 20, the sensing circuit 40 is configured to sensing whether a crack is present in the semiconductor die 100A according to a parasitic resistor between the two sensing points 27 of the seal ring 20. In some embodiments, the number of sensing circuits 40 is determined according to various processing technologies.

Figure 1B:
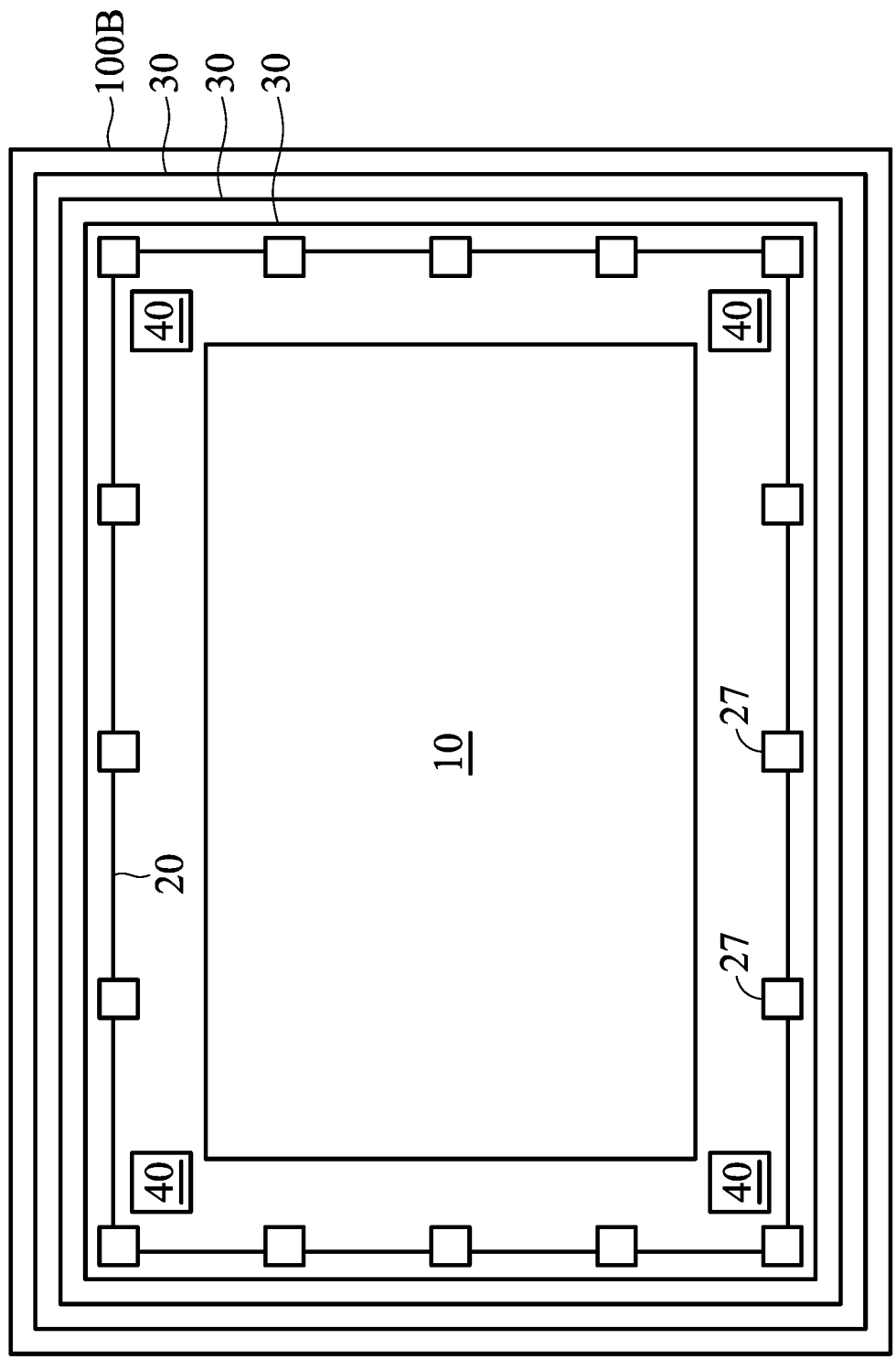
FIG. 1B shows a semiconductor die according to another embodiment of the invention.

FIG. 1B shows a semiconductor die 100B according to another embodiment of the invention. Compared with the semiconductor die 100A of FIG. 1A, the semiconductor die 100B further comprises a plurality of seal rings 30. The seal rings 20 and 30 are formed on the exterior side of the IC region 10 and surround the entire IC region 10. In other words, the IC region 10 is completely surrounded by the seal rings 20 and 30. The seal ring 20 is disposed between the IC region 10 and the seal rings 30. In some embodiments, the seal ring 20 is disposed outside the IC region 10 and the seal rings 30. In some embodiments, the seal ring 20 is disposed between two adjacent seal rings 30. The seal rings 20 and 30 are used as a blocking wall for protecting the IC region 10 from external stress while a semiconductor wafer comprising the semiconductor dies 100B is diced. In FIG. 1B, the seal ring 20 and the seal rings 30 have different structures in the semiconductor dies 100B. Compared with the seal rings 30, the seal ring 20 is further used as a sensor for detecting cracks in the semiconductor dies 100B through the sensing points 27. It should be noted that the number of seal rings 30 is used as an example, and not to limit the invention.

Figure 2:
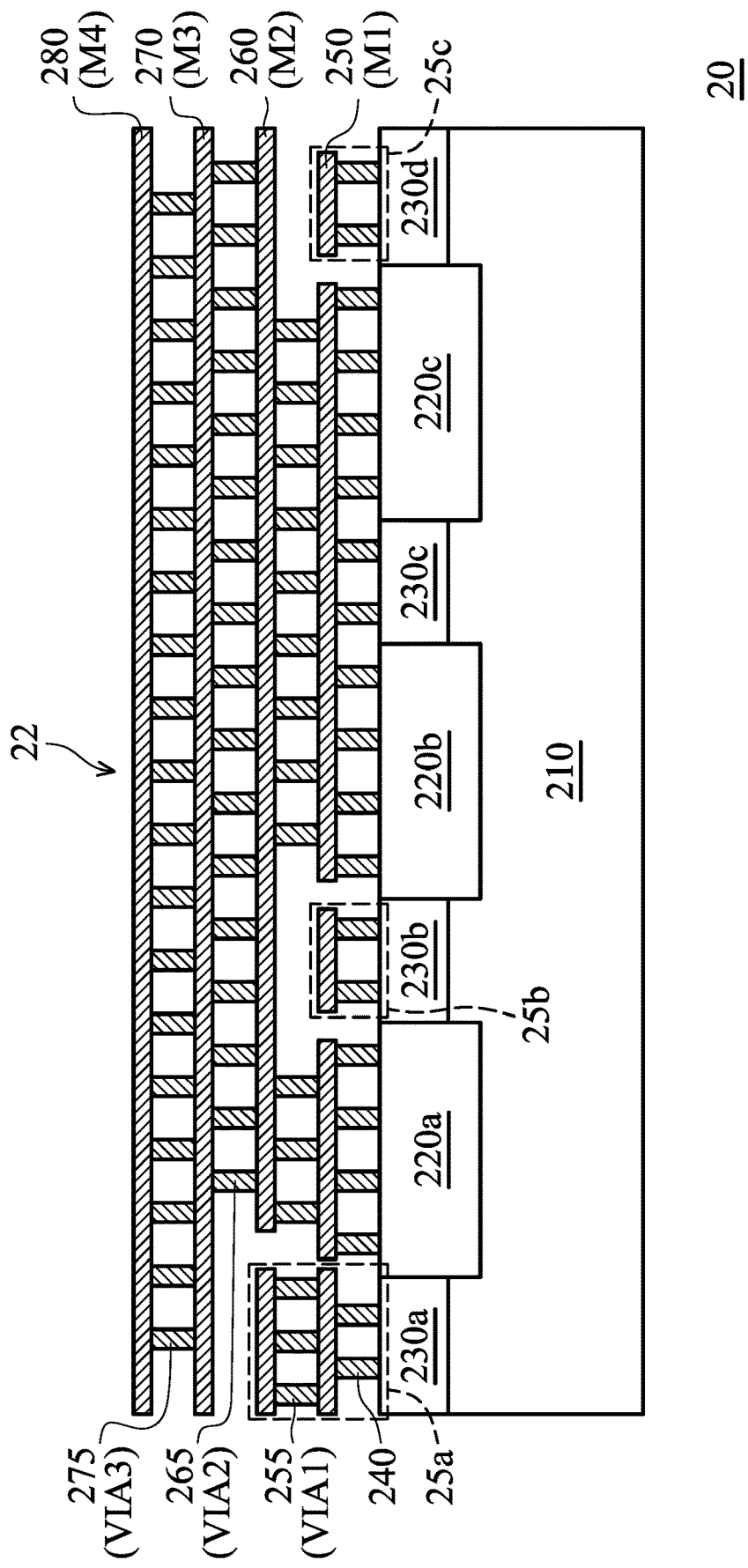
FIG. 2 shows a seal ring structure of the seal ring 20 of FIGS. 1A and 1B according to an embodiment of the invention.

FIG. 2 shows a seal ring structure of the seal ring 20 of FIGS. 1A and 1B according to an embodiment of the invention. In FIG. 2, the seal ring structure illustrates a cross-sectional view of the seal ring 20 along the extending direction of the seal ring 20. A semiconductor substrate 210 is provided in the seal ring structure. In some embodiments, the semiconductor substrate 210 is a P-type substrate, e.g., Si substrate. A plurality of shallow trench isolation (STI) regions 220a through 220c are formed over the semiconductor substrate 210. Furthermore, a plurality of P-type doping regions 230a through 230d are formed over the semiconductor substrate 210. In FIG. 2, the STI regions 220a through 220c and the P-type doping regions 230a through 230d are alternately arranged over the semiconductor substrate 210. For example, the STI region 220a is disposed between the P-type doping regions 230a and 230b, and the P-type doping region 230b is disposed between the STI regions 220a and 220b. Furthermore, the P-type doping regions 230a through 230d are separated from each other by the STI regions 220a and 220c. In some embodiments, the P-type doping region 230a, 230b, 230c or 230d is a P-type heavy doping region (e.g., P+ region). The seal ring 20 comprises a main interconnect element 22 and a plurality auxiliary interconnect elements 25. The main interconnect element 22 is formed on the STI regions 220a through 220c and a first group of the P-type doping regions (e.g., 230c). Furthermore, the main interconnect element 22 completely surrounds the IC region 10. Each of the auxiliary interconnect elements 25a through 25c is formed on a second group of the P-type doping regions (e.g., 230a, 230b and 230d) that are separated from the first group of the P-type doping regions. Moreover, the auxiliary interconnect elements 25a through 25c are formed below a portion of the main interconnect element 22. In other words, the auxiliary interconnect elements 25a through 25c are surrounded by the main interconnect element 22. Furthermore, each of the auxiliary interconnect element 25a through 25c is coupled to the individual sensing point 27 of FIGS. 1A and 1B.

In FIG. 2, the main interconnect element 22 comprises a plurality of contact 240, a plurality of levels of conductive lines 250, 260, 270 and 280, and a plurality of levels of vias 255, 265 and 275 that are alternately stacked over the semiconductor substrate 210. In the main interconnect element 22, the contacts 240 are formed on the STI regions 220a through 220c and the P-type doping region 230c. Moreover, the conductive lines 250 are formed in a first metal layer M1 over the contacts 240, the conductive lines 260 are formed in a second metal layer M2 over the first metal layer M1, the conductive lines 270 are formed in a third metal layer M3 over the second metal layer M2, and the conductive lines 280 are formed in a fourth metal layer M4 over the third metal layer M3. Furthermore, the vias 255 are formed in a first via layer VIA1 between the first metal layer M1 and the second metal layer M2, the vias 265 are formed in a second via layer VIA2 between the second metal layer M2 and the third metal layer M3, and the vias 275 are formed in a third via layer VIA3 between the third metal layer M3 and the fourth metal layer M4.

In FIG. 2, the auxiliary interconnect element 25a comprises a plurality of contact 240, a plurality of levels of conductive lines 250 and 260, and a plurality of levels of vias 255 that are alternately stacked over the semiconductor substrate 210. In the auxiliary interconnect element 25a, the contacts 240 are formed on the P-type doping region 230a. In the embodiment, only two levels of conductive lines 250 and 260 are used to form the auxiliary interconnect element 25a, and therefore the height of the auxiliary interconnect element 25a is less than that of the main interconnect element 22. Furthermore, the auxiliary interconnect element 25b comprises a plurality of contact 240 and a level of conductive line 250. In the auxiliary interconnect element 25b, the contacts 240 are formed on the P-type doping region 230b. Furthermore, single level of conductive line 250 is used to form the auxiliary interconnect element 25b, and therefore the height of the auxiliary interconnect element 25b is less than those of the main interconnect element 22 and the auxiliary interconnect element 25a. Similarly, the auxiliary interconnect element 25c comprises a plurality of contact 240 and a level of conductive line 250. In the auxiliary interconnect element 25c, the contacts 240 are formed on the P-type doping region 230d. In the embodiment, only one level of conductive line 250 is used to form the auxiliary interconnect element 25c, and therefore the height of the auxiliary interconnect element 25c is less than those of the main interconnect element 22 and the auxiliary interconnect element 25a.

In the seal ring 20, each of the auxiliary interconnect elements 25a through 25c is formed on the individual P-type doping region. Furthermore, the auxiliary interconnect elements 25a through 25c are electrically separated from the main interconnect element 22. In some embodiments, the main interconnect element 22 is coupled to a ground GND, and the auxiliary interconnect elements 25a through 25c are coupled to the corresponding sensing points.

Figure 3:
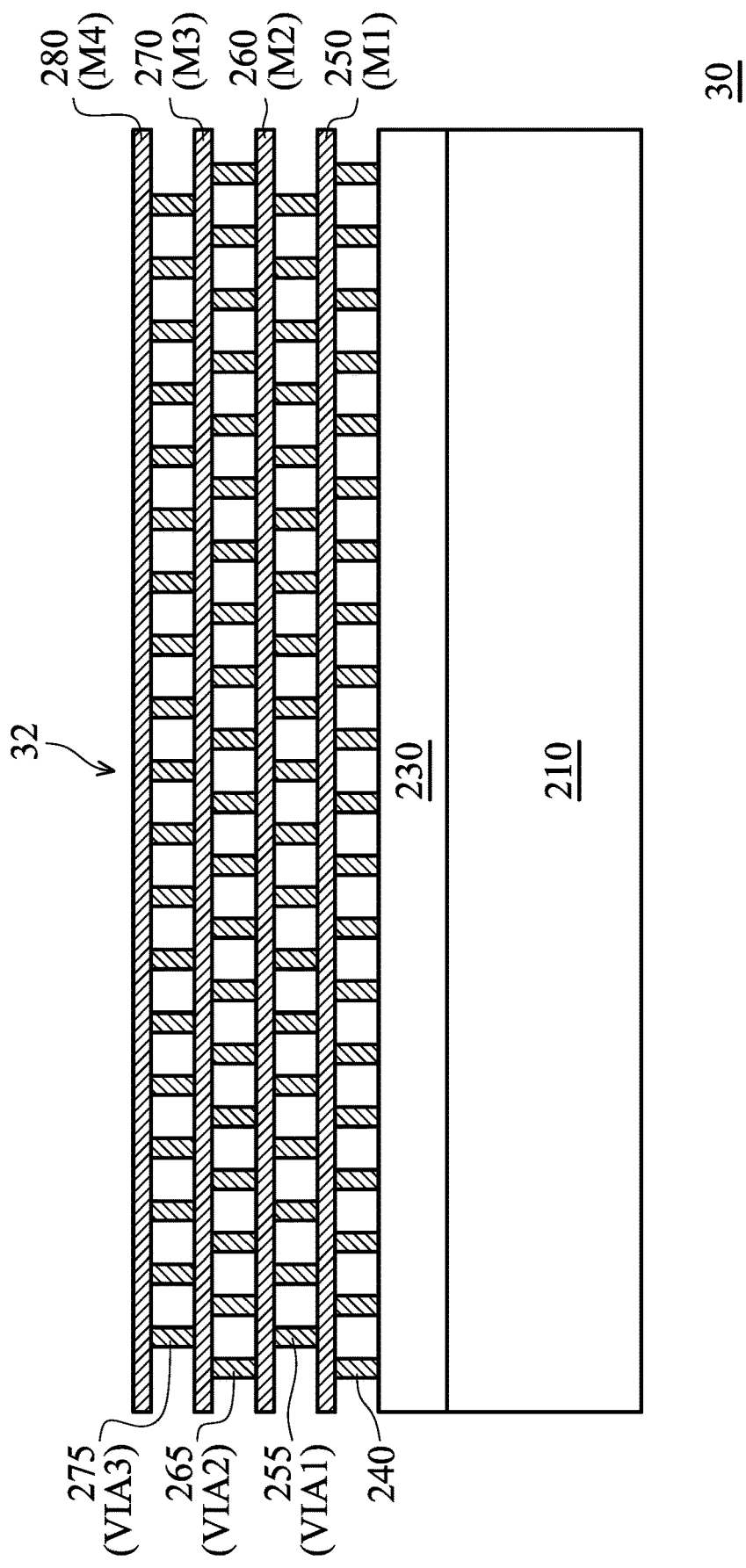
FIG. 3 shows a seal ring structure of the seal ring 30 of FIG. 1B according to an embodiment of the invention.

FIG. 3 shows a seal ring structure of the seal ring 30 of FIG. 1B according to an embodiment of the invention. In FIG. 3, the seal ring structure illustrates a cross-sectional view of the seal ring 30 along the extending direction of the seal ring 30. The semiconductor substrate 210 is provided in the seal ring structure. As described above, the semiconductor substrate 210 is a P-type substrate, e.g., Si substrate. A P-type doping region 230 is formed over the semiconductor substrate 210. Furthermore, the P-type doping region 230 is the first group of the P-type doping region. Compared with the seal ring structure of the seal ring 20, no STI region is formed in the seal ring structure of the seal ring 30. In some embodiments, the P-type doping region 230 is a P-type heavy doping region (e.g., P+ region). The seal ring 30 comprises a main interconnect element 32. The main interconnect element 32 is formed on the P-type doping region 230. Furthermore, the main interconnect element 32 completely surrounds the IC region 10. The main interconnect element 32 comprises a plurality of contact 240, a plurality of levels of conductive lines 250, 260, 270 and 280, and a plurality of levels of vias 255, 265 and 275 that are alternately stacked over the semiconductor substrate 210. In the main interconnect element 32, the contacts 240 are formed on the P-type doping region 230. Compared with the main interconnect element 22 of FIG. 2, the main interconnect element 32 has regular arrangement in the levels of conductive lines 250, 260, 270 and 280, and the levels of vias 255, 265 and 275. Furthermore, compared with the seal ring structure of the seal ring 20, no auxiliary interconnect element is formed in the seal ring 30. Thus, no sensing point is coupled to the seal ring 30.

Figure 4:
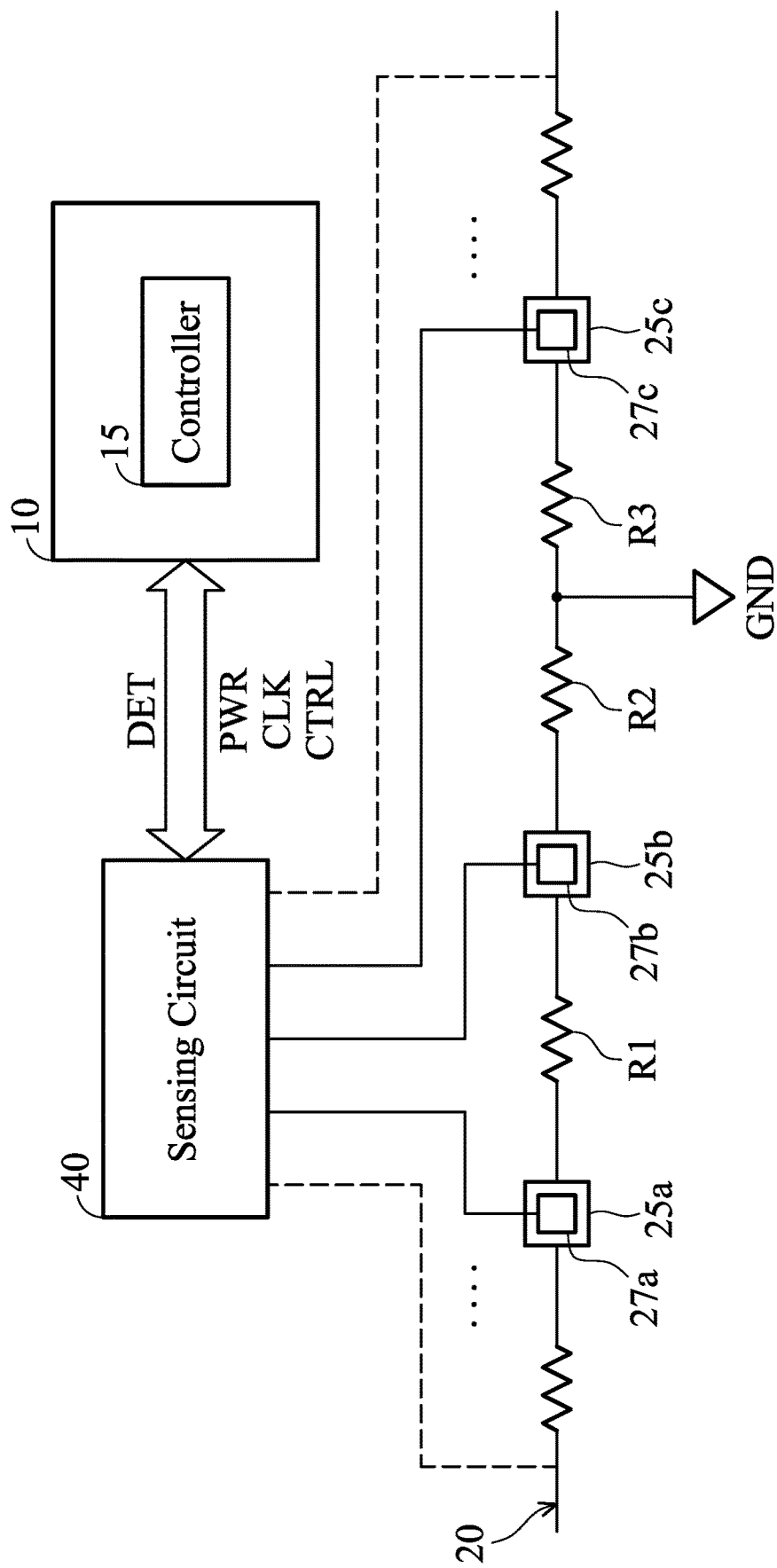
FIG. 4 shows a schematic illustrating a circuit block of the sensing circuit and the seal ring in a semiconductor die according to an embodiment of the invention.

FIG. 4 shows a schematic illustrating a circuit block of the sensing circuit 40 and the seal ring 20 in a semiconductor die (e.g., 100A of FIG. 1A or 100B of FIG. 1B) according to an embodiment of the invention. The sensing circuit 40 and the seal ring 20 are configured to detect cracks in the semiconductor die. When the semiconductor die is powered, a controller 15 of the IC region 10 is configured to provide a power signal PWR and a clock signal CLK to the sensing circuit 40. Furthermore, the controller 15 provides a control signal CTRL to the sensing circuit 40, so as to control the sensing circuit 40 for measuring each resistance of the semiconductor substrate 210 between two of the auxiliary interconnect elements of the seal ring 20. Furthermore, the controller 15 is coupled to each auxiliary interconnect element 25 through the individual sensing point 27. For example, the controller 15 is coupled to the auxiliary interconnect elements 25a, 25b and 25c through the corresponding sensing points 27a, 27b and 27c and the conductive lines (not shown), respectively. In some embodiments, the conductive lines coupled to the sensing points 27a, 27b and 27c are formed in the first metal layer M1 and/or other metal layers.

Referring to FIG. 2 and FIG. 4 together, the resistor R1 represents a parasitic resistor from the P-type doping region 230a to the P-type doping region 230b through the semiconductor substrate 210 between the auxiliary interconnect elements 25a and 25b. Furthermore, the resistor R2 represents a parasitic resistor from the P-type doping region 230b to the P-type doping region 230c through the semiconductor substrate 210 between the auxiliary interconnect element 25b and the P-type doping region 230c. Moreover, the resistor R3 represents a parasitic resistor from the P-type doping region 230c to the P-type doping region 230d through the semiconductor substrate 210 between the auxiliary interconnect element 25c and the P-type doping region 230c. Furthermore, the semiconductor substrate 210 is grounded by the main interconnect element 22 and the P-type doping region 230c. If the controller 15 provides the control signal CTRL to the sensing circuit 40 for measuring a resistance of the resistor R1 in the semiconductor substrate 210, the sensing circuit 40 provides an input signal to one sensing point among the sensing points 27a and 27b, and then obtains an output signal corresponding to the input signal from another sensing point. For example, if the sensing circuit 40 provides an input signal to the sensing point 27a, the sensing circuit 40 may obtain an output signal from the sensing point 27b. Conversely, if the sensing circuit 40 provides an input signal to the sensing point 27b, the sensing circuit 40 may obtain an output signal from the sensing point 27a. Furthermore, if the input signal input to the seal ring 20 is an input voltage, the output signal from the seal ring 20 is an output current. Conversely, if the input signal input to the seal ring 20 is an input current, the output signal from the seal ring 20 is an output voltage. After obtaining the output signal, the sensing circuit 40 is configured to obtain the resistance of the resistor R1 according to the input signal and the output signal. In some embodiments, if the resistance of the resistor R1 is greater than a threshold resistance, the sensing circuit 40 determines that a crack is present, and then the sensing circuit 40 may provide a detection signal DET to notify the controller 15 that the portion of the semiconductor substrate 210 between the auxiliary interconnect elements 25a and 25b is damaged. Conversely, if the resistance of the resistor R1 is equal to or less than the threshold resistance, the sensing circuit 40 determines that no crack is present between the auxiliary interconnect elements 25a and 25b, and then the sensing circuit 40 provides the detection signal DET to notify the controller 15 that the portion of the semiconductor substrate 210 between the auxiliary interconnect elements 25a and 25b is normal. In some embodiments, if no output signal is obtained by the sensing circuit 40, the sensing circuit 40 determines that a crack is present and damages the portion of the semiconductor substrate 210 between the auxiliary interconnect elements 25a and 25b, and then the sensing circuit 40 provides the detection signal DET to notify the controller 15. Therefore, by using two of the auxiliary interconnect elements 25 in the seal ring 20 to measure the resistance of a portion of the semiconductor substrate 210, the sensing circuit 40 is capable of detecting cracks in the portion of the semiconductor substrate 210.

In some embodiments, the auxiliary interconnect elements 25 are arranged at equal intervals in the seal ring 20. In some embodiments, the auxiliary interconnect elements 25 are arranged at the locations in the seal ring 20 corresponding to the fragile area of the semiconductor substrate 210. Furthermore, when the number of auxiliary interconnect elements 25 is increased, the crack position is more accurate, thereby improving failure analysis for the semiconductor die. Furthermore, by arranging the sensing circuits 40 between the corners of the IC region 10 and the corners of the seal ring 20, the damage occurred at the corners of the semiconductor die can be monitored. For example, when a crack is present in one corner of the semiconductor die, the sensing circuit 40 corresponding to the corner may be damaged caused by the crack. Thus, the damaged sensing circuit 40 cannot measure the seal ring 20 and no detection signal DET is provided to the controller 15.

Figure 5:
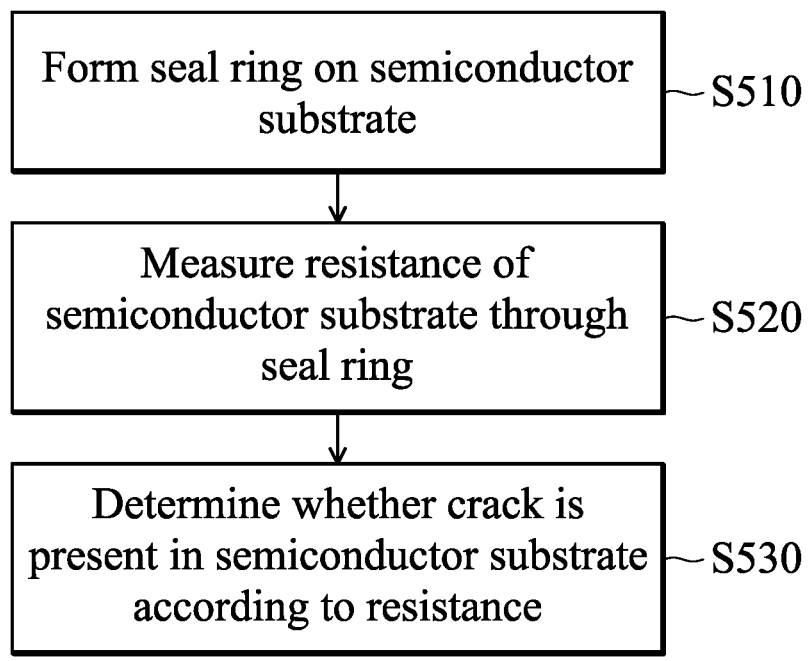
FIG. 5 shows a method for detecting cracks on a semiconductor die according to an embodiment of the invention.

FIG. 5 shows a method for detecting cracks on a semiconductor die according to an embodiment of the invention. First, in step S510, a seal ring 20 is formed on a semiconductor substrate 210 of a semiconductor die (e.g., 100A of FIG. 1A or 100B of FIG. 1B. As described above, the seal ring 20 comprises a main interconnect element 22 and a plurality auxiliary interconnect elements 25, and each auxiliary interconnect element 25 is formed below a portion of the main interconnect element 22. Next, in step S520, one or more sensing circuits 40 are used to measure the resistance of a portion of the semiconductor substrate 210 between two of the second interconnect elements 25 through the corresponding sensing points and the seal ring 20. In some embodiments, the sensing circuits 40 are arranged in inner corners of the seal ring 20 in layout. As described above, the sensing circuit 40 is configured to provide an input signal to a first sensing point, and then obtains an output signal corresponding to the input signal from a second sensing point (i.e., another sensing point). Next, in step S530, it is determined whether a crack is present in the semiconductor substrate according to the resistance. For example, according to the input signal and the output signal, the sensing circuit 40 is configured to obtain the first resistance of a portion of the semiconductor substrate 210 between the interconnect elements 25 coupled to the first and second sensing points. Therefore, when the number of sensing circuits 40 is increased, failure analysis of the semiconductor die accelerates. Furthermore, assuming that the second sensing point is arranged between the first and third sensing points in the seal ring 20, the sensing circuit 40 is further configured to provide an input signal to the second sensing point, and then obtains an output signal corresponding to the input signal from the third sensing point, so as to obtain the second resistance of a portion of the semiconductor substrate 210 between the auxiliary interconnect elements 25 coupled the second and third sensing points, and so on. Alternatively, the sensing circuit 40 is configured to provide an input signal to the third sensing point, and then obtains an output signal corresponding to the input signal from the second sensing point, so as to obtain the second resistance. Thus, by selecting the two sensing points from all of the sensing points in sequence, the semiconductor substrate 210 below the seal ring 20 can be scanned, so as to determine whether a crack is present. In some embodiments, the first sensing point is arranged between the second and third sensing points in the seal ring 20, and the sensing circuit 40 is further configured to provide an input signal to the first sensing point, and then obtains an output signal corresponding to the input signal from the third sensing point, so as to obtain the second resistance of a portion of the semiconductor substrate 210 between the auxiliary interconnect elements 25 coupled to the first and third sensing points.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A seal ring structure, comprising:
    a first seal ring on a semiconductor substrate, comprising:
        a first interconnect element formed on a shallow trench isolation (STI) region and a first group of P-type doping regions over the semiconductor substrate; and
        a plurality of second interconnect elements formed on a second group of P-type doping regions over the semiconductor substrate,
    wherein the second interconnect elements are electrically separated from the first interconnect element, and the first and second groups of P-type doping regions are separated by the STI region,
    wherein each of the second interconnect elements is formed on an individual one of the second group of P-type doping regions, and each of the second interconnect elements is formed below the first interconnect element so that the second interconnect elements are covered by the first interconnect element.

2. The seal ring structure as claimed in claim 1, wherein the first interconnect element comprises a plurality of levels of conductive lines that are alternately stacked over the semiconductor substrate, and each of the second interconnect elements comprises at least one level of conductive lines, wherein height of the first interconnect element is greater than that of the second interconnect elements.

3. The seal ring structure as claimed in claim 1, wherein the semiconductor substrate is grounded through the first interconnect element and the first group of P-type doping regions.

4. The seal ring structure as claimed in claim 1, further comprising:
    a second seal ring on the semiconductor substrate, comprising:
        a third interconnect element adjacent to the first seal ring, and formed on the first group of P-type doping regions over the semiconductor substrate.

5. A semiconductor die, comprising:
    a semiconductor substrate;
    an integrated circuit region on the semiconductor substrate; and
    a first seal ring on the semiconductor substrate, comprising:
        a first interconnect element completely surrounding the integrated circuit region, and formed on a shallow trench isolation (STI) region and a first group of P-type doping regions over the semiconductor substrate; and
        a plurality of second interconnect elements formed on a second group of P-type doping regions over the semiconductor substrate,
    wherein the second interconnect elements are electrically separated from the first interconnect element, and the first and second groups of P-type doping regions are separated by the STI region,
    wherein each of the second interconnect elements is formed on an individual one of the second group of P-type doping regions, and each of the second interconnect elements is formed below the first interconnect element so that the second interconnect elements are covered by the first interconnect element.

6. The semiconductor die as claimed in claim 5, wherein the first interconnect element comprises a plurality of levels of conductive lines that are alternately stacked over the semiconductor substrate, and each of the second interconnect elements comprises at least one level of conductive lines, wherein height of the first interconnect element is greater than that of the second interconnect elements.

7. The semiconductor die as claimed in claim 5, wherein the semiconductor substrate is grounded through the first interconnect element and the first group of P-type doping regions.

8. The semiconductor die as claimed in claim 5, further comprising:
at least one sensing circuit disposed between the integrated circuit region and the first seal ring, and configured to measure a resistance of a portion of the semiconductor substrate between two of the second interconnect elements, so as to determine whether a crack is present in the portion of the semiconductor substrate.

9. The semiconductor die as claimed in claim 8, wherein the sensing circuit is disposed between a first corner of the integrated circuit region and a second corner of the first seal ring.

10. The semiconductor die as claimed in claim 8, wherein the sensing circuit provides an input voltage to one of the two second interconnect elements, and obtains an output current from the other of the two second interconnect elements, wherein the sensing circuit obtains the resistance of the portion of the semiconductor substrate according to the input voltage and the output current.

11. The semiconductor die as claimed in claim 8, wherein the sensing circuit provides an input current to one of the two second interconnect elements, and obtains an output voltage from the other of the two second interconnect elements, wherein the sensing circuit obtains the resistance portion of the semiconductor substrate according to the input current and the output voltage.

12. The semiconductor die as claimed in claim 5, further comprising:
a second seal ring on the semiconductor substrate, comprising:
a third interconnect element completely surrounding the integrated circuit region and adjacent to the first seal ring, and formed on the first group of P-type doping regions over the semiconductor substrate.

13. A method for detecting cracks on a semiconductor die, comprising:
forming a seal ring on a semiconductor substrate of the semiconductor die, wherein the seal ring comprises:
a first interconnect element completely surrounding the integrated circuit region, and formed on a shallow trench isolation (STI) region and a first group of P-type doping regions over the semiconductor substrate; and
a plurality of second interconnect elements formed on a second group of P-type doping regions over the semiconductor substrate;
measuring, using at least one sensing circuit, the resistance of a portion of the semiconductor substrate between two of the second interconnect elements through the seal ring; and
determining whether a crack is present in the portion of the semiconductor substrate according to the resistance of the portion of the semiconductor substrate,
wherein each of the second interconnect elements is formed on an individual one of the second group of P-type doping regions, and each of the second interconnect elements is formed below the first interconnect element so that the second interconnect elements are covered by the first interconnect element.

14. The method as claimed in claim 13, wherein the first interconnect element comprises a plurality of levels of conductive lines that are alternately stacked over the semiconductor substrate, and each of the second interconnect elements comprises at least one level of conductive lines, wherein height of the first interconnect element is greater than that of the second interconnect elements.

15. The method as claimed in claim 13, further comprising:
grounding the semiconductor substrate through the first interconnect element and the first group of P-type doping regions.

16. The method as claimed in claim 13, wherein the sensing circuit is disposed between the integrated circuit region and the seal ring.

17. The method as claimed in claim 16, wherein the sensing circuit is disposed between a first corner of the integrated circuit region and a second corner of the seal ring.

18. The method as claimed in claim 16, wherein the step of measuring the resistance of the portion of the semiconductor substrate between two of the second interconnect elements through the seal ring further comprises:
providing an input signal to one of the two second interconnect elements; obtaining an output signal from the other of the two second interconnect elements; and
obtaining the resistance of the portion of the semiconductor substrate according to the input signal and the output signal.

19. The method as claimed in claim 18, wherein when the input signal is an input voltage, the output signal is an output current, and when the input signal is an input current, the output signal is an output voltage.

20. The method as claimed in claim 18, wherein the step of determining whether the crack is present in the portion of the semiconductor substrate according to the resistance of the portion of the semiconductor substrate further comprises:
determining that the crack is present when no output signal is obtained or the resistance is greater than a threshold resistance.

* * * * *